US009357667B2

(12) United States Patent
He et al.

(10) Patent No.: US 9,357,667 B2
(45) Date of Patent: May 31, 2016

(54) MOUNTING APPARATUS FOR BATTERY MODULE

(71) Applicant: ScienBiziP Consulting (Shen Zhen) Co., Ltd., Shenzhen (CN)

(72) Inventors: Yu-Wei He, Shenzhen (CN); Xiu-Quan Hu, Shenzhen (CN)

(73) Assignee: ScienBiziP Consulting(Shenzhen)Co.,Ltd., Shenzhen (CN)

( * ) Notice: Subject to any disclaimer, the term of this patent is extended or adjusted under 35 U.S.C. 154(b) by 411 days.

(21) Appl. No.: 13/960,839

(22) Filed: Aug. 7, 2013

(65) Prior Publication Data

US 2014/0160716 A1  Jun. 12, 2014

(30) Foreign Application Priority Data

Dec. 12, 2012  (CN) .......................... 2012 1 0534087

(51) Int. Cl.
*H01M 2/10* (2006.01)
*H05K 7/14* (2006.01)
*G06F 1/18* (2006.01)
*H01M 10/667* (2014.01)

(52) U.S. Cl.
CPC *H05K 7/14* (2013.01); *G06F 1/188* (2013.01); *H01M 2/10* (2013.01); *H01M 2/1016* (2013.01); *H01M 10/667* (2015.04); *H01M 2220/10* (2013.01)

(58) Field of Classification Search
CPC .......................... H01M 10/46; H01M 10/5004
See application file for complete search history.

(56) References Cited

U.S. PATENT DOCUMENTS

| 5,429,531 | A  | * | 7/1995  | Oster    | H01R 11/281 439/762 |
| 5,905,632 | A  | * | 5/1999  | Seto     | G06F 1/1616 361/679.55 |
| 5,933,330 | A  | * | 8/1999  | Beutler  | H01M 2/1022 320/114 |
| 6,188,574 | B1 | * | 2/2001  | Anazawa  | B60K 1/04 180/68.5 |
| 7,859,590 | B2 | * | 12/2010 | Yanagida | H02J 7/0045 348/372 |
| 8,054,648 | B2 | * | 11/2011 | Wang     | H01M 2/1044 361/807 |
| 8,092,932 | B2 | * | 1/2012  | Phillips | B25F 5/02 429/100 |
| 2001/0046624 | A1 | * | 11/2001 | Goto | H01M 2/105 429/99 |

(Continued)

*Primary Examiner* — Hoa C Nguyen
*Assistant Examiner* — Xanthia C Cunningham
(74) *Attorney, Agent, or Firm* — Novak Druce Connolly Bove + Quigg LLP

(57) ABSTRACT

A battery mounting apparatus requiring a minimum of screw fixings includes an enclosure, two positioning members, and a supporting mechanism. The enclosure includes a rear wall defining two ventilation openings. A separated board is formed between the two ventilation openings. Each of the two positioning members includes a first latching portion and a first clipping thumb extending from the first latching portion. The first latching portion of each positioning member is engaged with a first edge of the two ventilation openings, in two opposite directions. The supporting mechanism securing a battery module is secured to the two positioning members, preventing the two positioning members from moving parallel to the rear wall, and the battery module is secured to the enclosure via the two latching members and by the supporting mechanism other than with screws.

20 Claims, 7 Drawing Sheets

(56) References Cited

U.S. PATENT DOCUMENTS

| | | | | |
|---|---|---|---|---|
| 2002/0114983 A1* | 8/2002 | Frank | H01M 16/006 | 429/9 |
| 2003/0039881 A1* | 2/2003 | Mount | H01M 2/1077 | 429/100 |
| 2007/0148537 A1* | 6/2007 | Nakatani | H01M 2/1066 | 429/100 |
| 2010/0059644 A1* | 3/2010 | Sun | H01M 2/1044 | 248/309.1 |
| 2011/0039129 A1* | 2/2011 | Lee | H01M 2/0404 | 429/7 |
| 2011/0129704 A1* | 6/2011 | Han | H01M 2/1061 | 429/82 |
| 2012/0274570 A1* | 11/2012 | Kim | H04M 1/0237 | 345/168 |
| 2013/0095359 A1* | 4/2013 | Yoshioka | H01M 2/1016 | 429/99 |
| 2013/0273398 A1* | 10/2013 | Hoshi | H01M 2/1077 | 429/61 |
| 2014/0168915 A1* | 6/2014 | Wang | H01M 2/1027 | 361/752 |
| 2014/0193678 A1* | 7/2014 | Kim | H01M 2/06 | 429/72 |
| 2014/0242438 A1* | 8/2014 | Tanaka | H01M 2/024 | 429/121 |
| 2014/0287291 A1* | 9/2014 | Miyawaki | H01M 2/1077 | 429/120 |
| 2014/0342199 A1* | 11/2014 | McLaughlin | H01M 10/5004 | 429/61 |

* cited by examiner

MOUNTING APPARATUS FOR BATTERY MODULE

BACKGROUND

1. Technical Field

The present disclosure relates to mounting apparatuses, and more particularly to a mounting apparatus for a battery module.

2. Description of Related Art

A server always includes a standby battery. The standby battery may be received in a box, and the box may be attached to the enclosure with screws, to secure the standby battery to a rear wall of the enclosure. Usually, the rear wall defines two ventilation openings for dissipating heat, and the presence of too many securing holes defined in the rear wall, to secure the box, may adversely influence strength of the rear wall. Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
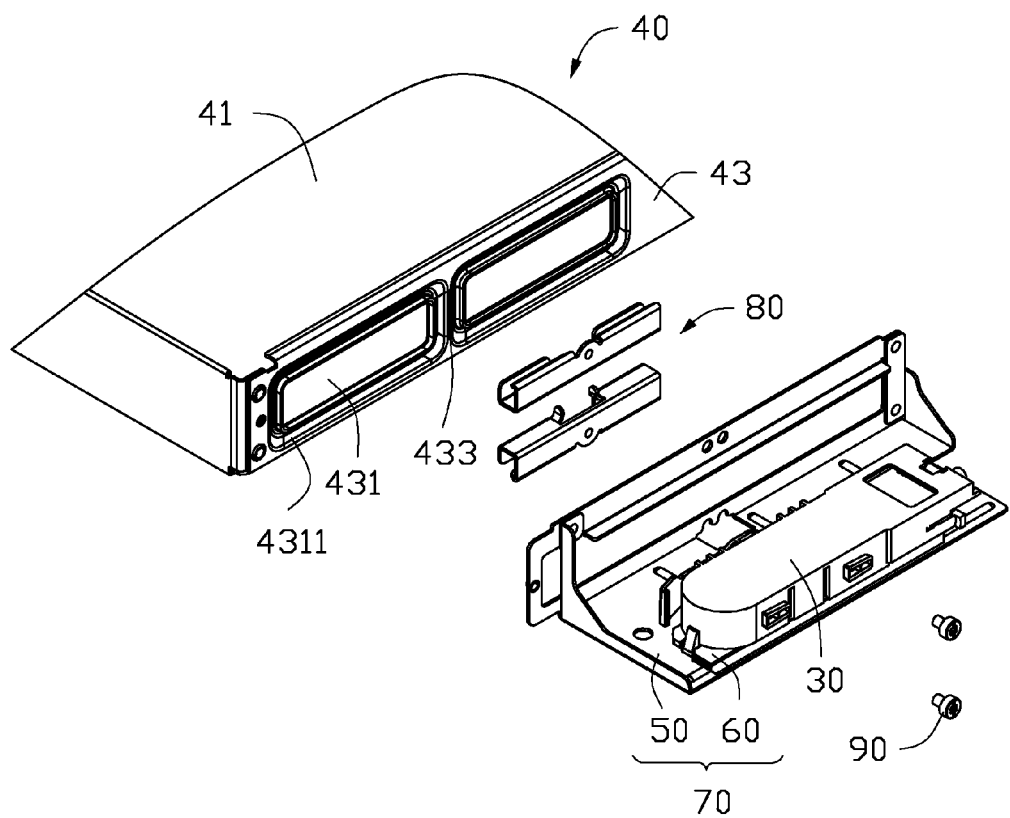
FIG. 1 is an exploded, isometric view of a mounting apparatus and a battery module in accordance with an embodiment, the mounting apparatus including an enclosure, two positioning members, and a supporting mechanism.

FIG. 1 shows that a mounting apparatus of an embodiment. The mounting apparatus includes an enclosure 40, a supporting mechanism 70 and two positioning members 80. The supporting mechanism 70 and the two positioning members 80 are configured to secure a battery module 30 to the enclosure 40.

Figure 3:
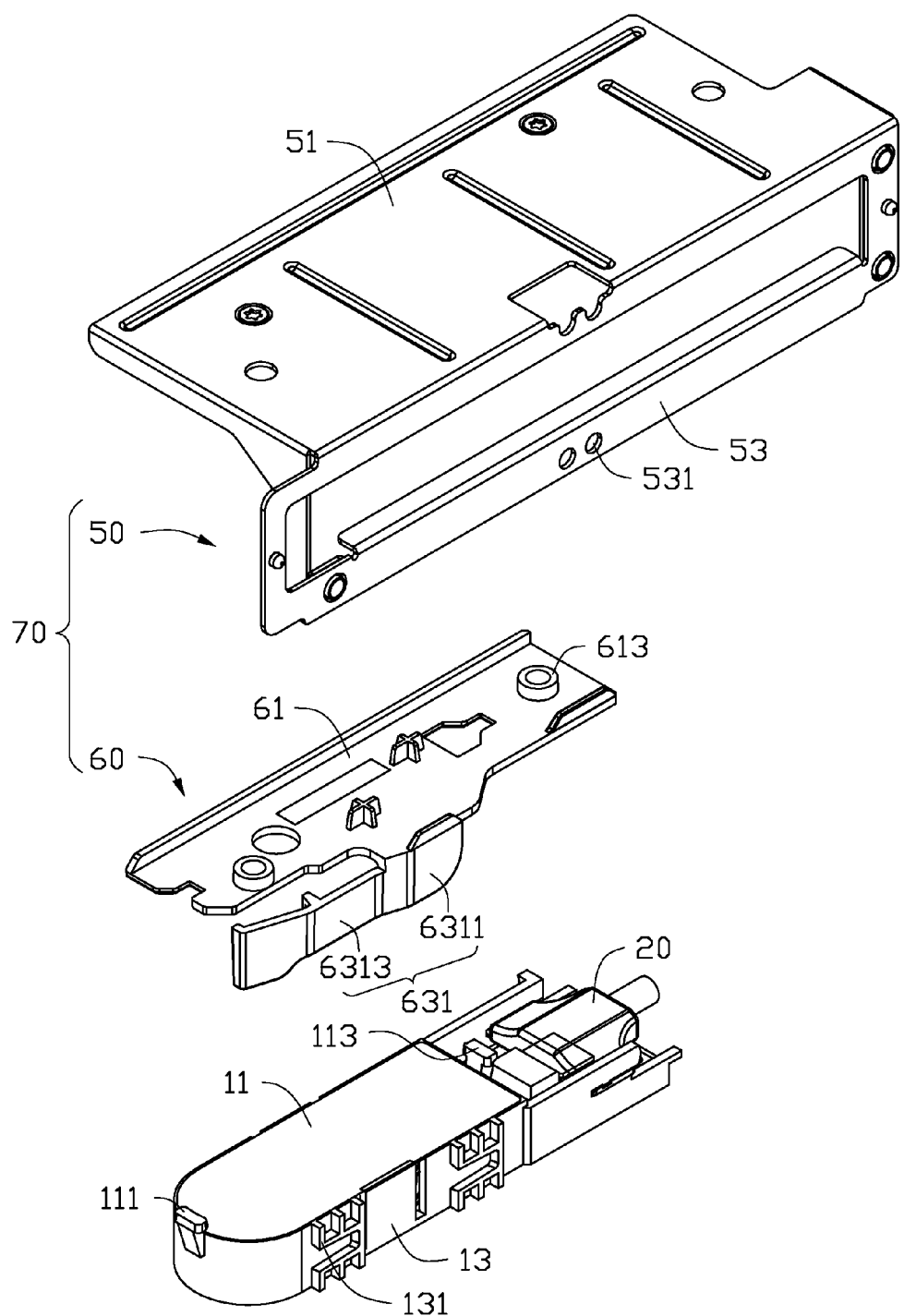
FIG. 3 is an exploded, isometric view of the supporting mechanism of FIG. 1.
Figure 4:
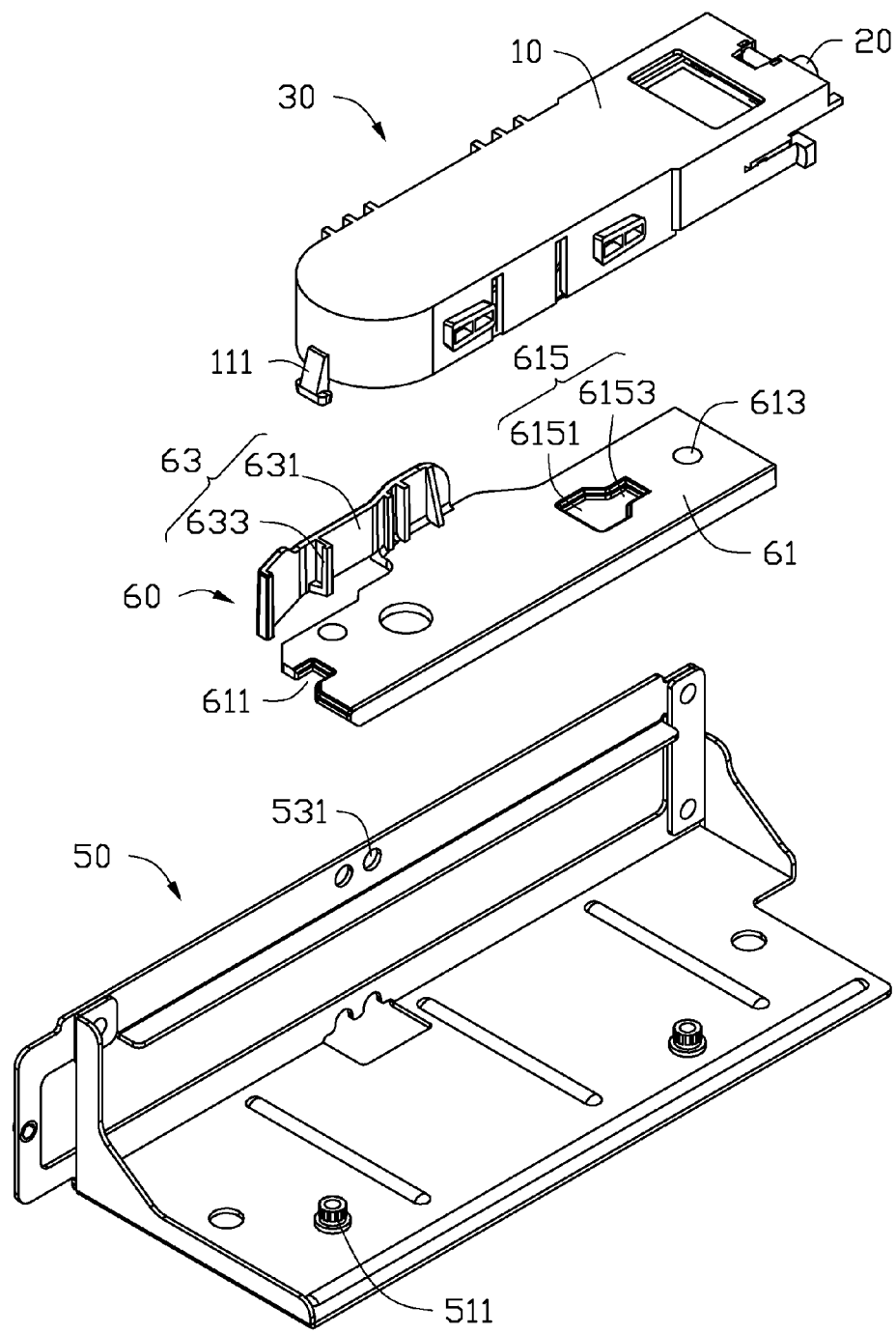
FIG. 4 is similar to FIG. 3, but viewed from a different aspect.

FIGS. 3 and 4 show that the battery module 30 includes a receiving box 10 and a body 20 received in the receiving box 10. The receiving box 10 includes a receiving bottom wall 11 and a receiving sidewall 13, perpendicularly connected to the receiving bottom wall 11. A first hook 111 and a second hook 113 are located on opposite sides of the receiving bottom wall 11. A blocking tab 131 extends outwards from the receiving sidewall 13.

The enclosure 40 includes a bottom plate 41 and a rear wall 43. The rear wall 43 extends upwards from the bottom plate 41 and is perpendicular to the bottom plate 41. Two ventilation openings 431 are defined in the rear wall 43, and a separated board 433 is formed between the two ventilation openings 431. A flange 4311 surrounds each of the two ventilation openings 431.

The supporting mechanism 70 includes a supporting bracket 50 and a securing bracket 60 installed on the supporting bracket 50. The supporting bracket 50 includes a supporting plate 51 and a hanging frame 53 connected to the supporting plate 51. The hanging frame 53 defines two locking holes 531 corresponding to the two positioning members 80. The two locking holes 531 are in one line, and the line is perpendicular to the supporting plate 51.

The securing bracket 60 includes a securing board 61 and a locking piece 63 located on the securing board 61. The securing board 61 is secured to the supporting plate 51, and two limiting posts 613 protrude from a bottom portion, of the securing board 61, so that there is a predetermined distance between the securing board 61 and the supporting plate 51. The securing board 61 further defines a cutout 611 and an engaging hole 615 corresponding to the first hooks 111 and the second hook 113 of the battery module 30. The cutout 611 and the locking piece 63 are arranged at two adjacent edges of the securing board 61. The engaging hole 615 is far from the cutout 611 and includes a wide portion 6151 and a narrow portion 6153, in communication with the wide portion 6151. A width of the narrow portion 6153 is smaller than a width of the wide portion 6151.

The locking piece 63 includes a piece body 631 and a stopping tab 633 located on the piece body 631. The piece body 631 includes a segment portion 6311 and a resilient portion 6313. The segment portion 6311 extends from the securing board 61, and the resilient portion 6313 extends from the segment portion 6311. The segment portion has a first extension direction, and the resilient portion 6313 has a second extension direction. In one embodiment, the first extension direction is substantially perpendicular to the securing board 61, and the second extension direction is parallel to the securing board 61. The stopping tab 633 is arranged at an inner side of the resilient portion 6313, corresponding to the blocking tab 131.

Figure 2:
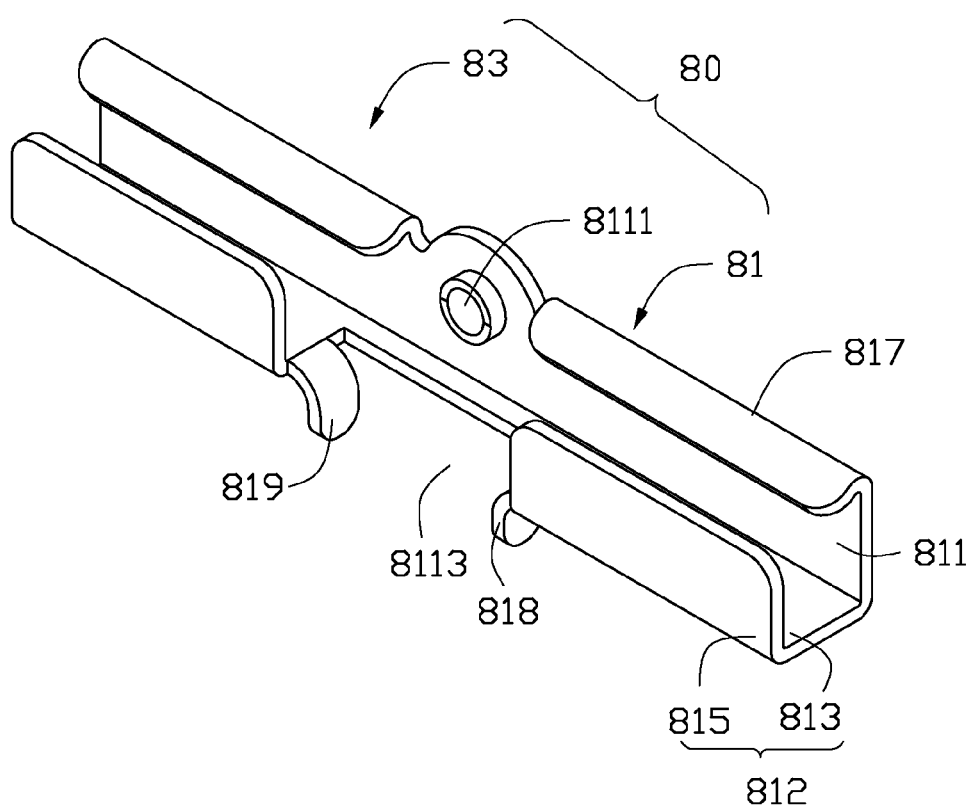
FIG. 2 is an isometric view of one of the two positioning members of FIG. 1.

FIG. 2 shows that each of the positioning members 80 includes a first latching portion 81 and a second latching portion 83, that is integrated with the first latching portion 81. The first latching portion 81 and the second latching portion 83 are mirror symmetry and each of the first latching portion 81 and the second latching portion 83 includes a resisting piece 811, an engaging portion 812, and a brim piece 817. The resisting piece 811 of the first latching portion 81 and the second latching portion 83 are integrated with each other. A securing hole 8111 is defined between the resisting piece 811 of the first latching portion 81 and the second latching portion 83. The securing hole 8111 of each of the two positioning members 80 is aligned with each of the two locking holes 531 of the supporting bracket 50. The engaging portion 812 further includes a connecting piece 813 and a latching piece 815. The connecting piece 813 extends towards the rear wall 43 from a bottom edge of the resisting piece 811. The latching piece 815 extends upwards from the connecting piece 813 and is arranged at a same side of the connecting piece 813 as the resisting piece 811. In one embodiment, the connecting piece 813 is perpendicular to the resisting piece 811 and the latching piece 815, and the latching piece 815 is parallel to the resisting piece 811. The brim piece 817 extends towards the rear wall 43 from a top edge of the resisting piece 811.

A gap 8113 is defined between the engaging portion 812 of the first latching portion 81 and the second latching portion 83, for receiving the separated board 433. A first clipping thumb 818 and a second clipping thumb 819 extend from the connecting piece 813 of the first latching portion 81 and the second latching portion 83 respectively. The first clipping thumb and the second clipping thumb 819 are positioned in the gap 8113 and are substantially arc-shaped.

Figure 5:
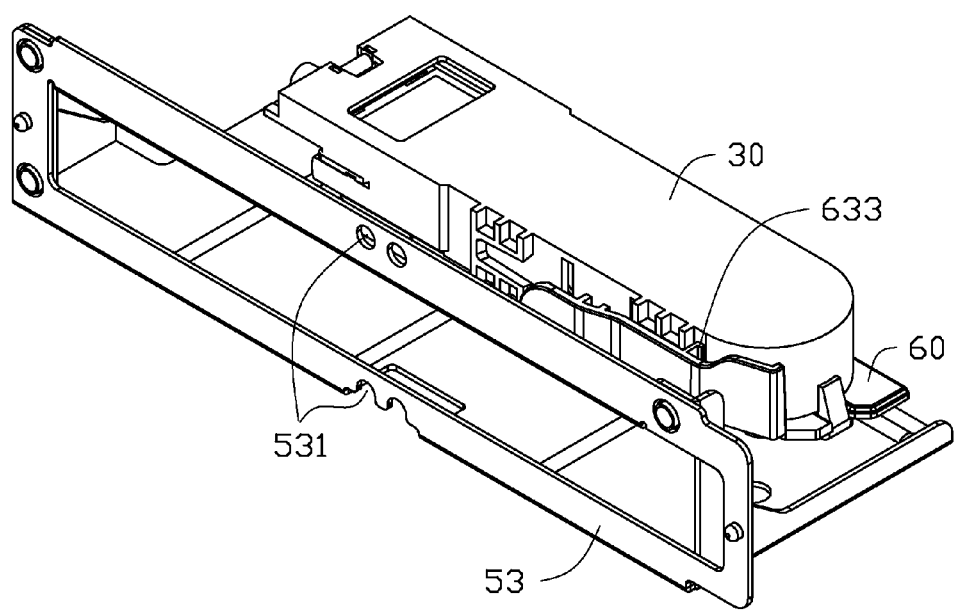
FIG. 5 is an assembled view of the supporting mechanism of FIG. 4.

FIG. 5 shows that, in assembly, the securing bracket 60 is secured to the supporting bracket 50 in a well-known way, such as with screws or by soldering. The first hook 111 is aligned with the cutout 611, and the second hook 113 of the battery module 30 is inserted into the wide portion 6151 of the engaging hole 615. A force is applied to the resilient portion 6313 of the locking piece 63, and the battery module 30 is pushed along a first direction, until the first hook 111 engages in the cutout 611, and the second hook 113 engages in the narrow portion 6153 of the engaging hole 615. The resilient portion 6313 resiliently rebounds to engage the stopping tab 633 with the blocking tab 131, to prevent the battery module 30 from moving along a second direction opposite to the first direction. The battery module 30 is thereby secured to the supporting mechanism 70.

Figure 6:
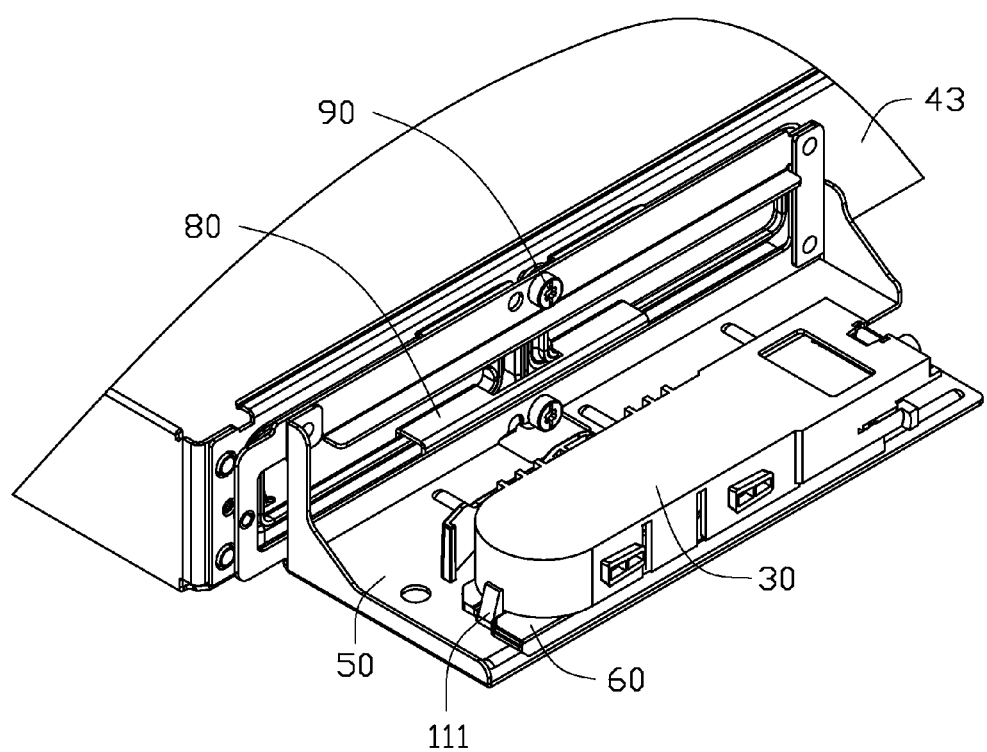
FIG. 6 is an assembled view of the devices in FIG. 1.
Figure 7:
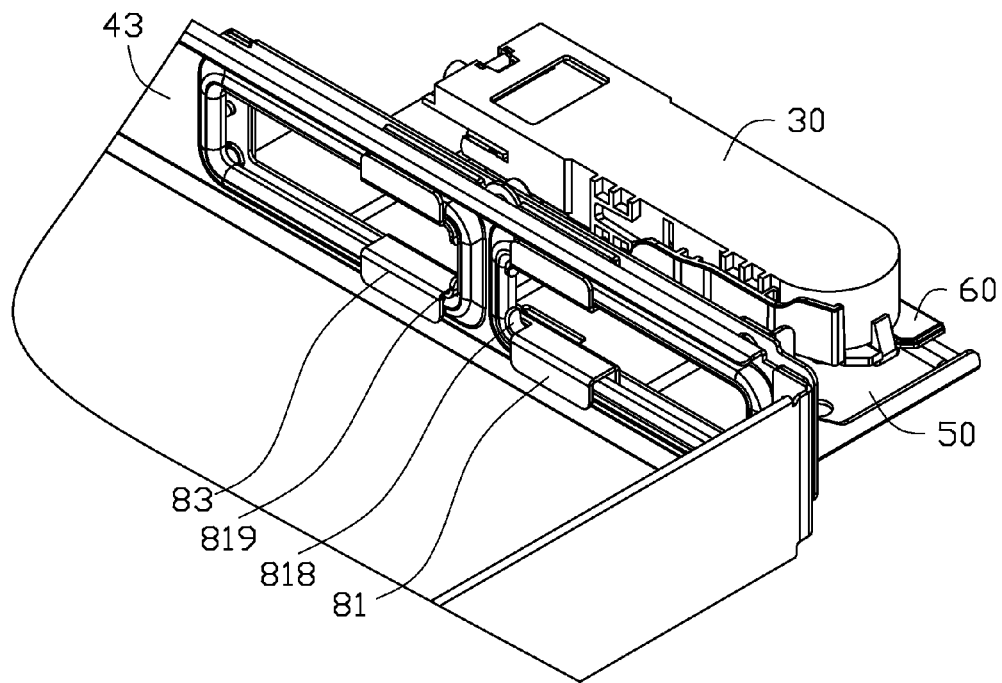
FIG. 7 is similar to FIG. 6, but viewed from a different aspect.

FIGS. 6 and 7 illustrate that, in the assembly of one embodiment, the first latching portion 81 of one of the two positioning members 80 of is engaged with a top edge of one of the two ventilation openings 431, and the second latching portion 83 of the one of the two positioning members 80 is engaged with a top edge of another one of the two ventilation openings 431. Thus, the latching piece 815 and the resisting piece 811 of the one of the two positioning members 80 abut two opposite edges of ventilation openings 431, and the brim piece 817 is engaged with the flange 4311 of ventilation opening 431. Therefore, the one of the two positioning members 80 is engaged with the top edge of the two ventilation openings 431 along a third direction. The other one of the two positioning members 80 is engaged with a bottom edge opposite to the top edge of the two ventilation openings 431 along a fourth direction, which is opposite to the third direction.

The supporting mechanism 70 and the battery module 30 are placed on one side of the enclosure 40. Each of the two locking holes 531 is aligned with the securing hole 8111 of each of the two positioning members 80. Two fasteners 90 are locked into the two locking holes 531 and the securing hole 8111 of the two positioning members 80. The supporting mechanism 70 and the battery module 30 is thus assembled to the enclosure 40.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A mounting apparatus comprising:
    an enclosure comprising a rear wall, the rear wall defines two ventilation openings, and a separated board being formed between the two ventilation openings;
    two positioning members, each of the two positioning members comprising a first latching portion and a first clipping thumb, extending from the first latching portion; the first latching portion of the two positioning members being respectively engaged with a first edge of the two ventilation openings in two opposite directions; and the first clipping thumb of the two positioning members being clamped with the separated board; and
    a supporting mechanism configured to secure a battery module and being secured to the two positioning members, for preventing the two positioning members from moving relative to the rear wall.

2. The mounting apparatus of claim 1, wherein each of the two positioning members further comprises a second latching portion integrated with the first latching portion; and the second latching portion of the two positioning members are respectively engaged with a second edge opposite to the first edge of the two ventilation openings in the two opposite directions.

3. The mounting apparatus of claim 2, wherein each of the two positioning members further comprises a second clipping thumb extending from the second latching portion; and the second clipping thumb of the two positioning members are clamped with the separated board.

4. The mounting apparatus of claim 3, wherein each of the first latching portion and the second latching portion comprises a resisting piece and an engaging portion, and the resisting piece and the engaging portion abut two opposite edges of the corresponding ventilation opening.

5. The mounting apparatus of claim 4, wherein the engaging portion comprises a connecting piece and a latching piece, the connecting piece perpendicularly extends from the resisting piece, and the latching piece perpendicularly extends from the connecting piece.

6. The mounting apparatus of claim 4, wherein a gap is defined between the engaging portion of the first latching portion and the second latching portion, and the separated board is received in the gap.

7. The mounting apparatus of claim 6, wherein each of the first clipping thumb and the second clipping thumb extends from the engaging portion of each of the first latching portion and the second latching portion and located on the gap.

8. The mounting apparatus of claim 1, wherein the supporting mechanism comprises a supporting member and a securing bracket secured to the supporting member; the supporting member is secured to the two positioning members; and the securing bracket is configured to the secure the battery module.

9. The mounting apparatus of claim 8, wherein the securing bracket comprises a securing board, the securing board defines a cutout and an engaging hole; and the cutout and the engaging hole are configured to receive a first hook and a second hook located on the battery module, for preventing the battery module from moving along a first direction parallel to the securing board.

10. The mounting apparatus of claim 9, wherein the securing bracket further comprises a locking piece located on the securing board; the locking piece comprises a piece body and a stopping tab located on the locking piece; and the stopping tab is configured to be engaged with the battery module, for preventing the battery module from moving along a second direction opposite to the first direction.

11. A mounting apparatus comprising:
    an enclosure comprising a rear wall, the rear wall defining two ventilation openings, and a separated board being formed between the two ventilation openings;
    two positioning members engaged with the two ventilation openings in two opposite directions; and
    a supporting mechanism comprising a supporting bracket and a securing bracket secured to the supporting bracket; the supporting bracket being secured to the two positioning members, for preventing the two positioning members from moving in a plane that is parallel to the rear wall; and the securing bracket is configured to secure a battery module.

12. The mounting apparatus of claim 11, wherein the securing bracket comprises a securing board, the securing board defines a cutout and an engaging hole; and the cutout and the engaging hole are configured to receive a first hook and a second hook located on the battery module, for preventing the battery module from moving along a first direction parallel to the securing board.

13. The mounting apparatus of claim 12, wherein the engaging hole comprises a wide portion and a narrow portion in communication with the wide portion; and the second hook is configured to extend through the wide portion to be engaged into the narrow portion.

14. The mounting apparatus of claim 12, wherein the securing bracket further comprises a locking piece located on the securing board; and the locking piece is configured to be engaged with the battery module, for preventing the battery module from moving along a second direction opposite to the first direction.

15. The mounting apparatus of claim 14, wherein the locking piece comprises a piece body and a stopping tab; and the stopping tab is configured to engage with the battery module, and the piece body is resilient deformable to disengage the stopping tab from the battery module.

16. The mounting apparatus of claim 11, wherein each of the two positioning members further comprises a first latching portion and a second latching portion integrated with the first latching portion; the first latching portion and the second latching portion of one of the two positioning members are engaged with a top edge of the two ventilation openings along a third direction; and the first latching portion and the second latching portion of another one of the two positioning members are engaged with the two ventilation openings along a fourth direction opposite to the third direction.

17. The mounting apparatus of claim 16, wherein each of the first latching portion and the second latching portion comprises a resisting piece and an engaging portion; and the resisting piece and the engaging portion abut two opposite edges of the corresponding ventilation opening.

18. The mounting apparatus of claim 17, wherein the engaging portion comprises a connecting piece and a latching piece, the connecting piece perpendicularly extends from the resisting piece, and the latching piece perpendicularly extends from the connecting piece.

19. The mounting apparatus of claim 17, wherein a gap is defined between the engaging portion of the first latching portion and the second latching portion, and the separated board is received in the gap.

20. The mounting apparatus of claim 18, wherein each of the first latching portion and the second latching portion further comprises a first clipping thumb and a second clipping thumb, the first clipping thumb and the second clipping thumb extend from the connecting piece of the first latching portion and the second latching portion; and the first clipping thumb and the second clipping are clamped the separated board in two opposite sides.

* * * * *